April 21, 1970 W. L. BOULÉ ET AL 3,508,124

SEMICONDUCTOR DEVICE AND METHOD OF MANUFACTURE

Filed March 11, 1968 3 Sheets-Sheet 1

INVENTORS.
WILFRED L. BOULÉ,
ELVERY DEAN LOWRY
and CLIFFORD ORMAN

BY David M. Keay

AGENT.

INVENTORS.
WILFRED L. BOULÉ,
ELVERY DEAN LOWRY
and CLIFFORD ORMAN

BY David M. Keay

AGENT.

INVENTORS,
WILFRED L. BOULÉ,
ELVERY DEAN LOWRY
and CLIFFORD ORMAN

BY David M. Keay
AGENT.

United States Patent Office 3,508,124

Patented Apr. 21, 1970

3,508,124

SEMICONDUCTOR DEVICE AND METHOD OF MANUFACTURE

Wilfred L. Boulé, Antrim, and Elvery Dean Lowry, Hillsboro, N.H., and Clifford Orman, Winchester, Mass., assignors to Sylvania Electric Products Inc., a corporation of Delaware Filed Mar. 11, 1968, Ser. No. 712,121
Int. Cl. H01l 1/14
U.S. Cl. 317—234 15 Claims

ABSTRACT OF THE DISCLOSURE

Silicon planar diode in which the silicon die is attached to molybdenum pins by (a) thin layers of silver alloyed to the silicon, (b) thicker layers of silver bonded to the thin layers, and (c) layers of silver and germanium bonded to the thick silver layers and to the molybdenum pins. A glass sleeve encircles the die and is sealed to the molybdenum pins.

In manufacturing the diode, the die with a layer of silver applied at each surface is positioned with the silver in contact with the layers of silver and germanium previously applied to the molybdenum pins and with the glass sleeve encircling the die and the inner ends of the pins. In a single heating operation the die is bonded to the pins and the glass sleeve is sealed to the pins.

BACKGROUND OF THE INVENTION

This invention relates to semiconductor electrical translating devices. More particularly, it is concerned with small, hermetically sealed silicon diodes.

Semiconductor diodes of the so-called planar construction employ a small semiconductor die having a diffused region of one conductivity type set in a bulk region of the opposite conductivity type as the electrically-active elements of each device. In producing devices of this construction, rectifying junctions are formed in a wafer of semiconductor material by diffusing a conductivity type imparting material into small regions at one surface of the wafer delineated by openings in an adherent protective coating of silicon oxide. The rectifying junctions may be extremely small; and, therefore, very small semiconductor dice each containing the two active regions of a diode are obtained upon dividing the wafer.

Each semiconductor die is mounted in an enclosure which protects the die and which supports the conductive members that provide electrical connections from the two active regions of the die to the exterior of the enclosure. In order to take full advantage of the small size of the semiconductor die, the enclosure should be very small. For many applications it is desirable that the enclosure be hermetically sealed in order more fully to protect the active semiconductor element. Other features desired in enclosed semiconductor diodes are good thermal conductivity between the semiconductor die and the exterior of the enclosure and high electrical conductivity between the regions of the semiconductor die and the conductive members. In addition, the construction of the device should be such as to avoid stresses on the semiconductor element and on the enclosure itself over a wide range of environmental and operational conditions.

It is also desirable that the active semiconductor element be bonded to the conductive members by an uncomplicated metal system in order to minimize the possibility of contamination and simplify assembly. Assembly of the device can be simply and economically performed if the materials of the metal system, the conductive members, and the remainder of the enclosure are compatible so as to permit bonding of the semiconductor die to the conductive members and sealing of the remainder of the enclosure to the conductive members in a single operation.

SUMMARY OF THE INVENTION

The foregoing features and advantages are provided by the improved semiconductor device and method of manufacture of the present invention. The semiconductor device in accordance with the present invention includes a body of silicon having a first region of one conductivity type with a surface area in one surface of the body and a second region of the opposite conductivity type with a surface area in the opposite surface of the body. Thin layers of silver are alloyed to the silicon at the surface areas in the two opposite surfaces, and thicker layers of silver are bonded to the two thin layers. A layer of a mixture of silver and semiconductor material is bonded to each of the thicker layers of silver and each layer of the mixture is also bonded to a conductive member of molybdenum. The body of silicon and portions of the molybdenum members are encircled by a glass sleeve which is sealed to the molybdenum members.

In producing semiconductor devices of the foregoing construction thin layers of silver are placed on the exposed surface areas in the two opposite surfaces of the body of silicon and the assembly is heated to alloy the silver to the body. Thicker layers of silver are then placed on the thinner layers. Portions of two members of molybdenum are coated with a layer of a mixture of silver and semiconductor material. The body of silicon and the molybdenum members are positioned in an arrangement with the thicker layers of silver each in contact with a layer of the mixture on a molybdenum member. The arrangement is heated to a temperature above the melting temperature of the mixture and subsequently cooled causing the molybdenum members to become bonded to the body of silicon. The arrangement may also include a glass sleeve encircling the body of silicon and portions of the molybdenum members, the glass having a temperature of sealing to molybdenum lower than the melting temperature of silver and higher than the melting temperature of the mixture of silver and semiconductor material. Then, when the arrangement is heated to the sealing temperature of the glass to molybdenum and subsequently cooled, the glass sleeve becomes sealed to the molybdenum members while the molybdenum members become bonded to the body of silicon.

BRIEF DESCRIPTION OF THE DRAWINGS

Additional objects, features, and advantages of semiconductor diodes and their method of manufacture in accordance with the invention will be apparent from the following detailed discussion and the accompanying drawings wherein.

Figure 1:
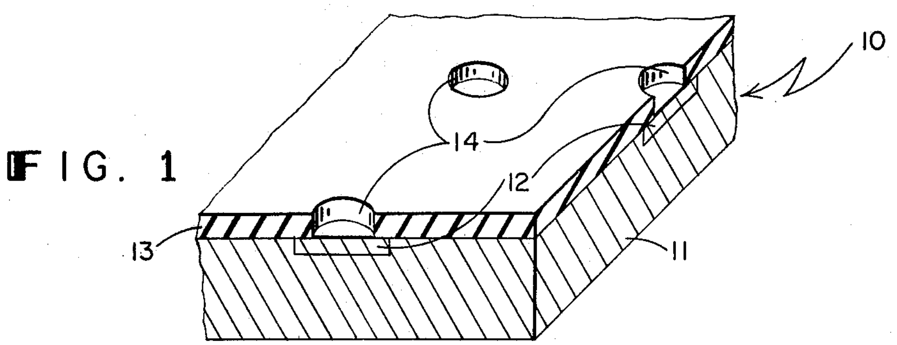
FIG. 1 is a perspective view in cross-section illustrating a fragment of a wafer of silicon having the active regions of diodes of the planar construction fabricated therein.

Because of the extremely small size of various portions of the items illustrated in the drawings, some of the dimensions of many of the items (particularly the thicknesses of the layers of materials) have been exaggerated with respect to other dimensions. It is believed that greater clarity of presentation is thereby obtained despite consequent distortion of elements in relation to their actual physical appearance.

DETAILED DESCRIPTION OF THE INVENTION

FIG. 1 illustrates a fragment of a wafer of silicon 10 having a bulk 11 of one conductivity type and a plurality of regions 12 of the opposite conductivity type formed by diffusion to provide the active regions of a plurality of diodes. The flat, upper major surface of the wafer is coated with a layer 13 of an adherent, protective, nonconductive material, typically a layer of silicon oxide. Openings 14 in the oxide coating expose surface areas of the diffused regions. The openings may be formed by employing the well-known photoresist masking and etching techniques utilized extensively in the semiconductor art. In a typical example the wafer may be approximately 5 mils thick, the oxide coating 10,000 angstrom units thick, and the openings 4 mils in diameter.

Figure 2:
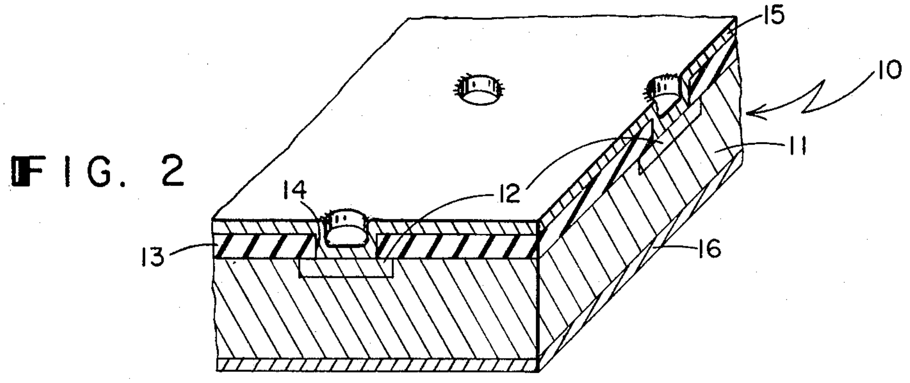
FIG. 2 is a perspective view in cross-section of the fragment of the wafer of FIG. 1 showing thin layers of silver applied to the upper and lower surfaces of the wafer.

Layers of silver 15 and 16 approximately 6,000 angstrom units thick are deposited on the upper and lower surfaces of the silicon wafer as illustrated in FIG. 2. The silver layers may be deposited by employing well-known vacuum deposition techniques. In order to improve adhesion between the silver and the silicon the wafer is sintered at a temperature of 750° C. in a nitrogen atmosphere for a period of 10 minutes.

The silver is then removed from the upper surface of the wafer except for small portions **15*a* at the openings 14** in the oxide coating. The excess silver is removed by well-known photosensitive resist masking and chemical etching techniques. Photosensitive resist material is applied to the surface of the silver layer, exposed to ultraviolet light through a mask having appropriate opaque and transparent regions, and then washed away except for the portions previously exposed to ultraviolet light through the mask, thus leaving protective resist material over the portions of the silver which are to remain. The unprotected silver is dissolved by immersing the wafer, with the bottom layer of silver suitably protected, in an etching solution containing 25 percent by volume of C.P. grade ammonium hydroxide, and 25 percent by volume of 30 percent by weight hydrogen peroxide solution, and 50 percent by volume of water for a period of about 5 to 15 seconds.

Figure 3:
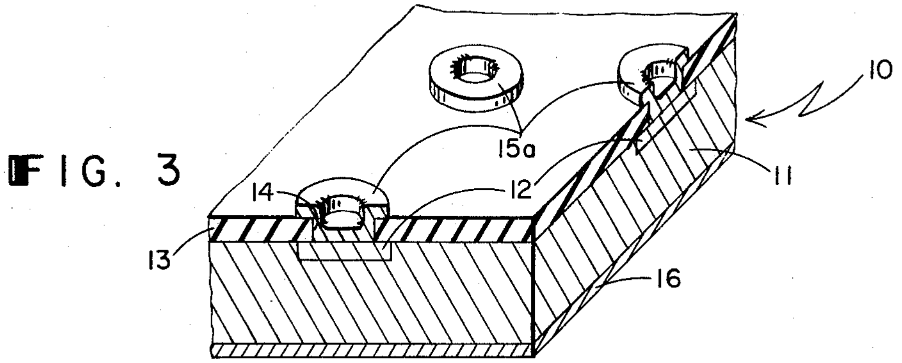
FIG. 3 is a perspective view in cross-section showing the fragment of the wafer with the silver of the upper layer removed except for limited portions overlying the exposed surface areas of the diffused regions.

The protective resist may then be removed by dissolving in a suitable solvent, or it may be burned off in the subsequent heating step to be described below. The resulting wafer is shown in FIG. 3.

The wafer is then placed in an alloying furnace with a nitrogen atmosphere at a temperature of between 950 and 1,000° C. for a period of 1½ minutes to alloy the thin silver layers to the silicon. In order to effect proper alloying the wafer is moved rapidly into the high temperature zone of the furnace, thus quickly bringing all of the wafer to the alloying temperature. The wafer is permitted to cool in a nitrogen atmosphere.

Following the alloying step the surfaces of the silver layers are treated to remove oxides by immersing the wafer in C.P. grade ammonium hydroxide for a period of 2 minutes. Then the wafer is immersed in an aqueous solution containing 90 percent by volume of 40 percent by weight ammonium fluoride solution and 10 percent by volume of standard 48 percent by weight hydrogen fluoride solution for a period of 15 seconds. This two stage cleaning operation removes any oxides from the silver surfaces, thus providing clean surfaces of silver to which thicker layers of silver, applied as described below, will readily adhere.

Figure 4:
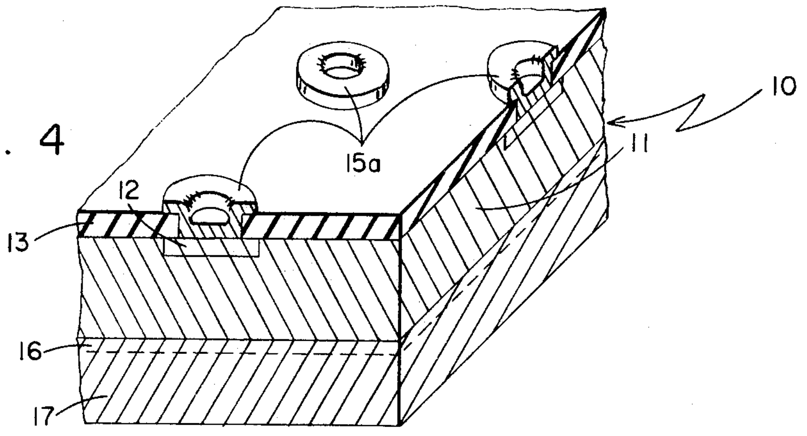
FIG. 4 is a perspective view view in cross-section illustrating the fragment of the wafer with a thicker layer of silver applied to the thin layer at the undersurface of the wafer.

Next, the wafer is placed in a vacuum deposition apparatus and a thick layer of silver 17 is vacuum deposited onto the cleaned undersurface of the wafer as shown in FIG. 4. The deposited layer of silver 17 is of the order of ½ mil thick. The wafer is again sintered in a nitrogen atmosphere at a temperature of 750° C. for a period of 10 minutes in order to produce good adhesion between the thick deposited layer of silver 17 and the thin alloyed layer 16.

Figure 5:
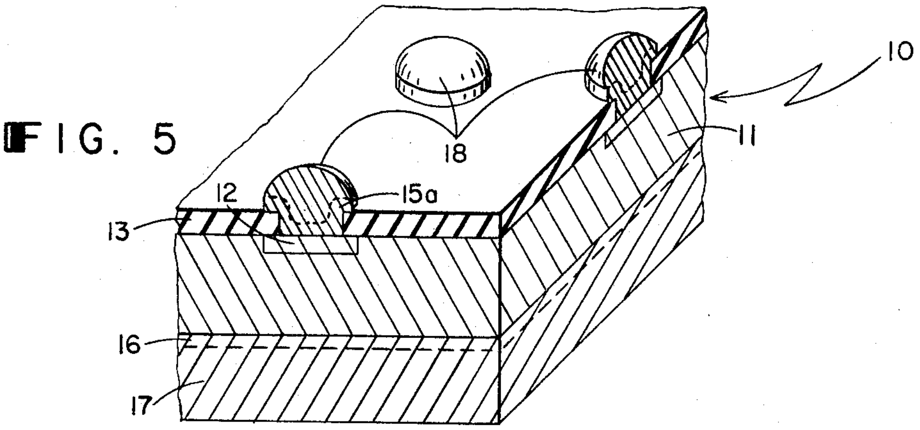
FIG. 5 is a perspective view in cross-section illustrating the fragment of the wafer with thicker layers of silver formed on the thin layers over each of the diffused regions at the upper surface of the wafer.

The wafer is then mounted on a conductive supporting member with the bottom layer of silver in electrical contact with the conductive supporting member. The supporting member and the bottom layer of silver are masked with a protective material and the assembly is immersed in a silver plating solution, for example, a standard silver cyanide plating bath. A cathode connection is made to the conductive supporting member and electroplating is carried out under appropriate conditions of current density and for a suitable time in accordance with the total surface area of the upper silver layer to produce raised silver members or buttons 18 approximately 3 mils thick as shown in FIG. 5.

Following the electroplating of the silver members 18, the wafer is removed from the plating supporting member and sliced into individual dice approximately 15 mils square. Each die contains a centrally located button 18 of silver which extends to well above the surface of the oxide coating and an underlying diffused region 12.

Figure 6:
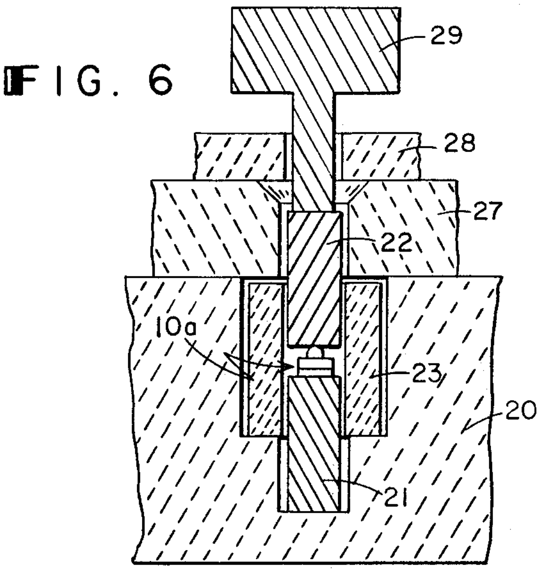
FIG. 6 is a cross-sectional view in elevation showing an individual silicon die from the wafer of FIG. 5 positioned in a heating jig together with suitably prepared pins of molybdenum and a glass sleeve in preparation for assembly.
Figure 7:
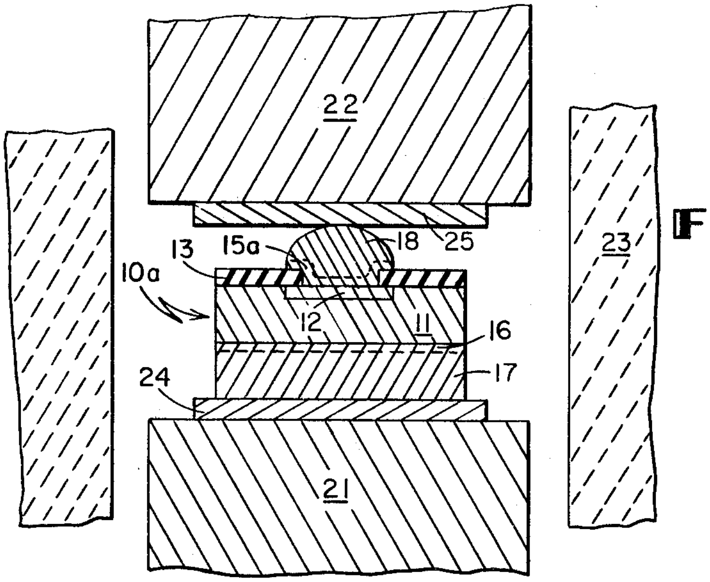
FIG. 7 is a cross-sectional view in elevation illustrating in detail the arrangement of the silicon die, molybdenum pins, and glass sleeve as shown in FIG. 6.

Each die **10*a* is then positioned in a suitable sealing jig 20 together with cylindrical conductive pins 21 and 22 and a glass sleeve 23 as illustrated in FIG. 6 and as shown in greater detail in FIG. 7. The conductive pins 21 and 22 are of cold-rolled molybdenum and have been tumbled, and then fired to remove gasses by passing through a belt furnace containing an atmosphere of wet hydrogen at a temperature of 1,050° C. for a period of approximately 30 minutes. After cleaning, a layer 24 and 25 of a mixture of silver and germanium is deposited on the flat end surfaces of the pins by vacuum deposition. The pins are suitably shielded when mounted in the deposition apparatus to insure that none of the mixture deposits on the cylindrical side surfaces of the pins. The pins are treated twice so that the mixture is deposited onto both end surfaces of each pin, and thus the orientation of the pins in the jig is immaterial. The proportions of silver and germanium in the mixture is of the order of the eutectic alloy. Specifically, a mixture consisting of approximately 15 percent germanium by weight has been found to be satisfactory. The melting point of this mixture is approximately 650° C. The deposited layers 24 and 25** of the mixture are approximately 12,000 angstrom units thick.

The glass sleeve 23 is of a suitable glass for sealing to molybdenum at a temperature lower than the melting temperature of silver and higher than the melting temperature of the mixture of silver and germanium. Specifically, a barium-lead-aluminoborosilicate glass which has less than 0.1 percent alkali content, seals to molybdenum at a temperature of approximately 825° C., and is sold by Corning Glass Works, Corning, N.Y., under the designation of Code 7061 has been found well suited for this purpose.

The jig 20, a fragment of which is shown in FIG. 6, is adapted to support the parts of several hundred devices in proper position for sealing in one operation. The parts are loaded into the jig by suitable bulk handling and loading mechanisms. In loading the jig, first the lower pins 21 and then the glass sleeves 23 are placed in appropriate recesses in the jig. A first cover plate 27 is positioned on the jig, and the individual dice **10*a* are each loaded into the space provided by a lower pin 21 and glass sleeve 23. Since the external configuration of the device will be the same at each end, whether the silver button on the die is up or down is immaterial. Next, the upper pins 22 are loaded into the jig, and a second cover plate 28 is positioned on the first cover plate 27. Stainless steel weights 29 are placed on the upper pins in order to provide contact pressure between the layers 24 and 25 of silver and germanium on the pins 21 and 22 and the silver layers 17 and 18 on the semiconductor die 10*a***.

The assembly sealing operation is perfomed in a vacuum type resistance furnace which is heated to a temperature of approximately 825° C. and contains an atmosphere of nitrogen. The loaded jig 20, containing the parts of several hundred devices arranged as shown in FIGS. 6 and 7, is placed in the furnace and the furnace chamber is evacuated to produce a vacuum of approximately 30 inches of mercury. The furnace chamber is held at this vacuum for a period of 3 minutes in order to remove gasses from the jig and the device parts. After the 3 minutes, the pressure in the furnace is increased to a vacuum of approximately 20 inches of mercury. At this time the temperature of the jig and parts is of the order of 600° C.

By 9 minutes from the time the jig was placed in the furnace, the temperature of the parts is approximately 825° C. Thus, the layers 24 and 25 of the silver-germanium mixture are molten and the glass is at the temperature of sealing to molybdenum. At this time nitrogen is introduced into the furnace to increase the pressure within the furnace chamber to atmospheric, and at the same time the jig is moved from the heating zone of the furnace to permit it to cool to room temperature.

The increase in the pressure on the exterior surfaces of the glass sleeve and the molybdenum pins forces the parts toward each other. Contact pressure is thus established between the molybdenum pins 21 and 22 and the die **10*a* as the molten silver germanium mixture starts to solidfy thereby producing a firm bond between the two layers of silver 17 and 18 on the die 10*a* and the molybdenum pins 21 and 22**, respectively. In its softened condition, the glass of the sleeve is pressed against the pins to provide a more intimate contact for sealing. In addition, the pressure differential urges softened glass of the sleeve into the inner cavity of the device so that it protrudes between the two molybdenum pins.

Figure 8:
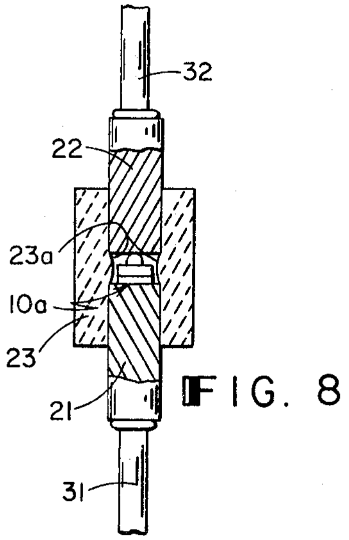
FIG. 8 is an elevational view partially in cross-section of a completed silicon diode in accordance with the invention.

The completed device after cooling is illustrated in FIG. 8. As shown in FIG. 8 pigtail leads 31 and 32 may be butt-welded to the outer end surfaces of the molybdenum pins if desired. The completed device may be very small, having, for example, overall dimensions of .075 inch in diameter and .160 inch in length, exclusive of pigtail leads. The device is of tough, rugged construction by virtue of the glass-to-molybdenum hermetic seals. The relatively thick layers of silver provide cushions between the silicon die and the molybdenum pins for absorbing the strains caused by expansion and contraction of the device parts. In addition, the inwardly extending portion **23*a*** of the glass sleeve which is of smaller diameter than the pins provides some protection for the silicon die from the forces of compression caused by either mechanical or thermal stresses on the pins.

The molybdenum pins provide very good heat dissipation for their size and the silicon-silver-molybdenum bonds provide an excellent heat conductive path between the die and the molybdenum pins. The alloyed silicon-silver-molybdenum bonds also provide very low resistance connections between the electrically active regions of the silicon die and the molybdenum pins. The alloyed silver connections avoid the problems of high resistance and susceptibility to mechanical shock associated with resilient or spring-member connections heretofore frequently employed between the conductive member and the diffused region. In addition, since the electroplated silver button contact overlies a very small portion of the surface area of the die, the capacitance of the device is low.

The metal system for bonding the silver to the molybdenum is simple and uncomplicated, employing only silver and germanium. Germanium is an inert semiconductor material which serves to lower the melting temperature of the bonding layer between the molybdenum and the silver to below that of silver without introducing any possible contaminating materials. The metal system in combination with the glass sleeve of proper sealing characteristics permits assembly of the parts to be performed in a single heating operation during which the silicon die is bonded to both conductive members and the glass sleeve is sealed to the molybdenum pin.

While there has been shown and described what is considered a preferred embodiment of the present invention, it will be obvious to those skilled in the art that various changes and modifications may be made therein without departing from the invention as defined in the appended claims.

What is claimed is:

1. A semiconductor device comprising
- a body of silicon having a first region of one conductivity type with a surface area in one surface of the body and having a second region of the opposite conductivity type with a surface area in the opposite surface of the body;
- a first thin layer of silver alloyed to the first region at the surface area in said one surface of the body;
- a second thin layer of silver alloyed to the second region at the surface area in said opposite surface of the body;
- a third layer of silver thicker than said first layer bonded to the first layer;
- a fourth layer of silver thicker than said second layer bonded to the second layer;
- a first member of molybdenum;
- a second member of molybdenum;
- a first layer of a mixture of silver and semiconductor material bonded to the first member of molybdenum and to the third layer of silver; and
- a second layer of the mixture of silver and semiconductor material bonded to the second member of molybdenum and to the fourth layer of silver.

2. A semiconductor diode comprising
- a body of silicon having flat, parallel, opposed major surfaces;
- said body including a first region of one conductivity type having a surface area in one surface of the body;
- the remainder of said body constituting a second region of the opposite conductivity type completely surrounding the first region except at the one surface;
- a coating of an adherent non-conductive material on said one surface of the body except for a portion of said surface area of the first region exposed by an opening in the coating;
- a first thin layer of silver alloyed to the first region at the portion of the one surface exposed by said opening;
- a second thin layer of silver alloyed to the second region at the opposite surface;
- a third layer of silver thicker than said first layer bonded to the first layer, the total thickness of the first and third layers of silver being greater than the thickness of the coating of non-conductive material;
- a fourth layer of silver thicker than said second layer bonded to the second layer;
- a first member of molybdenum;
- a second member of molybdenum;
- a first layer of a mixture of silver and semiconductor material bonded to the first member of molybdenum and to the third layer of silver; and a second layer of the mixture of silver and semiconductor material bonded to the second member of molybdenum and to the fourth layer of silver.

3. A semiconductor diode in accordance with claim 2 wherein the semiconductor material of the mixture of silver and semiconductor material is germanium.

4. A semiconductor diode in accordance with claim 3 wherein said first member of molybdenum is of generally cylindrical shape with a substantially flat end surface normal to the cylindrical axis of the member, and said first layer of said mixture is bonded to the flat end surface of the member;

said second member of molybdenum is of generally cylindrical shape with a substantially flat end surface normal to the cylindrical axis of the member, and said second layer of said mixture is bonded to the flat end surface of the member; and further including a glass sleeve encircling the body of silicon and the portions of the first and second members of molybdenum adjacent said flat end surfaces, and sealed to the cylindrical surfaces of said members.

5. A semiconductor diode in accordance with claim 4 wherein the glass sleeve is of a barium-lead-aluminoborosilicate glass having a sealing temperature to molybdenum of approximately 825° C; and the mixture of silver germanium consists of approximately 15 percent germanium by weight.

6. A semiconductor diode in accordance with claim 4 wherein the portion of the glass sleeve encircling the body of silicon and intermediate the portions sealed to the cylindrical surfaces of the members of molybdenum is of smaller internal diameter than the diameters of the members of molybdenum.

7. The method of producing a semiconductor device in accordance with the device of claim 1 including the steps of providing a body of silicon having a first region of one conductivity type with an exposed surface area in one surface of the body and having a second region of the opposite conductivity type with an exposed surface area in the opposite surface of the body;

placing a first thin layer of silver on the exposed surface area in said one surface of the body;

placing a second thin layer of silver on the exposed surface area in said opposite surface of the body;

heating the assembly to alloy the first and second layers of silver to said body;

placing a fourth layer of silver thicker than said second layer on said second layer;

placing a third layer of silver thicker than said first layer on said first layer;

coating a portion of a first member of molybdenum with a second layer of the mixture of silver and semiconductor material;

coating a portion of a second member of molybdenum with a second layer of the mixture of silver and semiconductor material;

positioning the body of silicon and the members of molybdenum in an arrangement with the third layer of silver in contact with the first layer of the mixture on the first member of molybdenum and with the fourth layer of silver in contact with the second layer of the mixture on the second member of molybdenum;

heating the arrangement to a temperature above the melting temperature of the mixture and subsequently permitting the arrangement to cool, thereby causing the members of molybdenum to become bonded to the body of silicon.

8. The method of producing a semiconductor device in accordance with claim 7 wherein prior to the step of heating the arrangement, a glass sleeve is positioned encircling the body of silicon and portions of the first and second members of molybdenum, the glass having a temperature of sealing to molybdenum lower than the melting temperature of silver and higher than the melting temperature of the mixture of silver and semiconductor material; and wherein the arrangement including the glass sleeve is heated to the sealing temperature of the glass to molybdenum whereby the glass sleeve becomes sealed to the members of molybdenum while the members of molybdenum become bonded to the body of silicon.

9. The method of producing a semiconductor device in accordance with claim 8 further including the step of increasing the ambient pressure on the exterior surfaces of the glass sleeve and the members of molybdenum when the arrangement is at the sealing temperature.

10. The method of producing a semiconductor diode in accordance with the device of claim 2 including the steps of providing a semiconductor element comprising a body of silicon having flat, parallel, opposed major surfaces, said body including a first region of one conductivity type having a surface area in one surface of the body, the remainder of said body constituting a second region of the opposite conductivity type completely surrounding the first region except at the one surface; and a coating of an adherent non-conductive material on said one surface of the body except for a portion of said surface area of the first region exposed by an opening in the coating;

placing a first thin layer of silver on the exposed portion of said surface area in the one surface of the body;

placing a second thin layer of silver on the opposite surface of the body;

heating the assembly to alloy the first layer of silver to the first region of the body and the second layer of silver to the second region of the body;

placing a fourth layer of silver thicker than said second layer on said second layer;

placing a third layer of silver thicker than said first layer on said first layer, the total thickness of the first and third layers of silver being greater than the thickness of the coating of non-conductive material;

coating a portion of a first member of molybdenum with a first layer of a mixture of silver and semiconductor material;

coating a portion of a second member of molybdenum with a second layer of the mixture of silver and semiconductor material;

positioning the semiconductor element and the members of molybdenum in an arrangement with the third layer of silver in contact with the first layer of the mixture on the first member of molybdenum and with the fourth layer of silver in contact with the second layer of the mixture on the second member of molybdenum;

heating the arrangement to a temperature above the melting temperature of the mixture and subsequently permitting the arrangement to cool, thereby causing the members of molybdenum to become bonded to the semiconductor element.

11. The method of producing a semiconductor diode in accordance with claim 10 wherein prior to the step of heating the arrangement, a glass sleeve is positioned encircling the semiconductor element and portions of the first and second members of molybdenum, the glass having a temperature of sealing to molybdenum lower than the melting temperature of silver and higher than the melting temperature of the mixture of silver and semiconductor material; and wherein the arrangement including the glass sleeve is heated to the sealing temperature of the glass to molybdenum whereby the glass sleeve becomes sealed to the members of molybdenum while the members of molybdenum become bonded to the semiconductor element.

12. The method of producing a semiconductor diode in accordance with claim 11 wherein the step of placing the first thin layer of silver on the exposed portion of the surface area in the one surface of the body comprises depositing a layer of silver on the surface of the semiconductor element including the surface of the coating of non-conductive material and the exposed portion of the surface area in the one surface of the body, placing protective material on the portion of the surface of said layer of silver overlying the said portion of the surface area in the one surface of the body, removing the layer of silver except for the portion protected by the protective material, and removing the protective material; and the step of placing a third layer of silver on said first layer comprises electroplating silver onto the said portion of the layer of silver.

13. The method of producing a semiconductor diode in accordance with claim 12 further including the step of increasing the ambient pressure on the exterior surfaces of the glass sleeve and the members of molybdenum when the arrangement is at the sealing temperature.

14. The method of producing a semiconductor diode in accordance with claim 13 wherein the semiconductor material of the first and second layers of the mixture of silver and semiconductor material is germanium and the mixture consists of approximately 15 percent germanium by weight; and the glass sleeve is of a barium-lead-aluminoborosilicate glass having a sealing temperature to molybdenum of approximately 825° C.

15. The method of producting a semiconductor diode in accordance with claim 14 including, subsequent to the step of heating the assembly to alloy the first and second layers of silver to the body and prior to the steps of placing the fourth and third layers of silver on the second and first layers, the steps of immersing the assembly in ammonium hydroxide, and immersing the assembly in an aqueous solution of ammonium fluoride and hydrogen fluoride.

References Cited

UNITED STATES PATENTS 3,381,185 4/1968 Whitman et al. ------ 317—234

JOHN W. HUCKERT, Primary Examiner

R. F. POLISSACK, Assistant Examiner

U.S. Cl. X.R.

29—588, 589; 317—235